United States Patent
Han (10) Patent No.: US 12,426,172 B2
(45) Date of Patent: Sep. 23, 2025

(54) VEHICLE BODY CONTROL DEVICE AND VEHICLE EMPLOYING DEVICE

(71) Applicants: Futaijing Precision Electronics (Yantai) Co., Ltd., Yantai (CN); HON HAI PRECISION INDUSTRY CO., LTD., New Taipei (TW)

(72) Inventor: Dian-Rong Han, New Taipei (TW)

(73) Assignees: Futaijing Precision Electronics (Yantai) Co., Ltd., Yantai (CN); HON HAI PRECISION INDUSTRY CO., LTD., New Taipei (TW)

( * ) Notice: Subject to any disclaimer, the term of this patent is extended or adjusted under 35 U.S.C. 154(b) by 209 days.

(21) Appl. No.: 18/216,737

(22) Filed: Jun. 30, 2023

(65) Prior Publication Data
US 2024/0324114 A1    Sep. 26, 2024

(30) Foreign Application Priority Data

Mar. 23, 2023    (CN) .......................... 202320592598.2

(51) Int. Cl.
| | |
|---|---|
| H05K 5/00 | (2025.01) |
| H05K 1/02 | (2006.01) |
| H05K 1/14 | (2006.01) |
| H05K 5/02 | (2006.01) |

(52) U.S. Cl.
CPC ........... *H05K 5/006* (2013.01); *H05K 1/0266* (2013.01); *H05K 5/0073* (2013.01); *H05K 5/0213* (2013.01)

(58) Field of Classification Search
CPC ........ H05K 5/0026; H05K 1/142; H05K 1/14; H05K 1/145; B60R 16/0231; B60R 16/023
See application file for complete search history.

(56) References Cited

U.S. PATENT DOCUMENTS

2024/0107674 A1*  3/2024  Cho ................. H05K 3/403
2024/0306288 A1*  9/2024  Ogura .............. H05K 1/0218

* cited by examiner

Primary Examiner — Timothy J Thompson
Assistant Examiner — Amol H Patel
(74) Attorney, Agent, or Firm — ScienBiziP, P.C.

(57) ABSTRACT

A body control device comprises a first circuit board, a plurality of first connectors, a communication control circuit, a second circuit board, a plurality of second connectors and a body control circuit. A size of the second circuit board is consistent with a size of the first circuit board. The communication control circuit is arranged on the first area of the first circuit board. The body control circuit is arranged on the second area of the second circuit board. The body control device can realize shell sharing of the communication control circuit and the body control circuit by setting the second circuit board and the first circuit board the same size and the communication control circuit and the body control circuit the same place. A vehicle is also provided.

16 Claims, 6 Drawing Sheets

VEHICLE BODY CONTROL DEVICE AND VEHICLE EMPLOYING DEVICE

TECHNICAL FIELD

The subject matter herein generally relates to vehicles.

BACKGROUND

With the improving of advanced driving assistance, the electrification degree of vehicle control, diversifying experience of the cockpit, remote control, and real-time communication, the electric control system in the vehicle is increasingly complex, resulting in complex of material supply, new parts introduction and integration are difficult.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure. It should be noted that references to "an" or "one" embodiment in this disclosure are not necessarily to the same embodiment, and such references mean "at least one".

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

According to different application scenarios and project requirements, the interface requirements of communication control circuit and body control circuit may change frequently, thus consuming a lot of resources to re-develop and re-design circuits.

Figure 1:
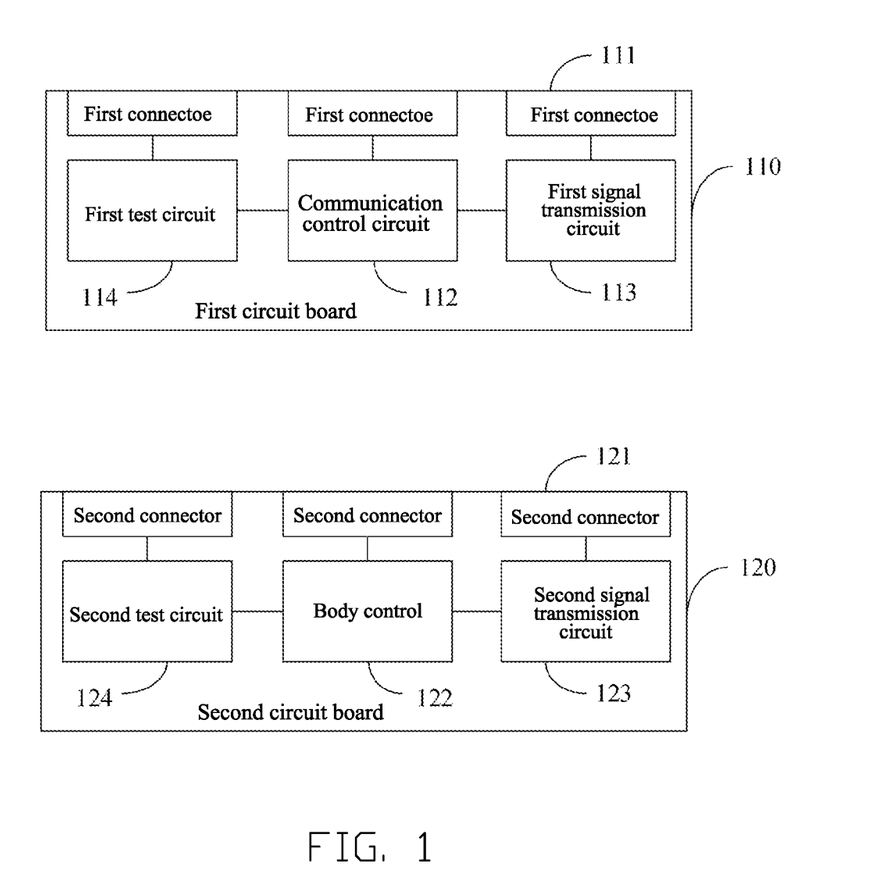
FIG. 1 is a diagram of one embodiment of a body control device according to the present application.

In order to meet different application scenarios and project requirements and reduce development resources, a body control device 100 is provided in this application with reference to FIG. 1. The body control device 100 comprises a first circuit board 110, a plurality of first connectors 111, a communication control circuit 112, a second circuit board 120, a plurality of second connectors 121, and a body control circuit 122.

The first circuit board 110 comprises a first area. The plurality of first connectors 111 are arranged on an outer edge of the first circuit board 110, and the plurality of first connectors are configured to electrically connect with an external device, and the plurality of first connectors 111 are configured to transmit communication signals. The communication control circuit 112 is arranged on the first area of the first circuit board 110, and the communication control circuit 112 is electrically connected with the plurality of the first connectors 111. The second circuit board 120 comprises a second area, and a position of the second area in the second circuit board 120 corresponds a position of the first area in the first circuit board 110. A size of the second circuit board 120 is consistent with a size of the first circuit board 110. The plurality of second connectors 121 are arranged on an outer edge of the second circuit board 120, and the plurality of second connectors 121 are configured to electrically connect with the external device, and the plurality of second connectors 121 are configured to transmit body control signals and/or vehicle drive signals. The body control circuit 122 is arranged on the second area of the second circuit board 120, the body control circuit 122 is electrically connected with the plurality of the second connectors 121, and the body control circuit 122 is configured to output the vehicle drive signals according to the body control signals.

In one embodiment, the communication control circuit 112 may comprise a microprocessor (MCU) or a system on chip (SOC). The communication control circuit 112 includes General-purpose input/output (GPIO) interface, Analog-to-Digital Converter (ADC) interface, Local Interconnect Network (LIN) interface, and Controller Area Network (CAN) interface to transmit a communication signal with external devices through the first connector 111. For example, the communication control circuit 112 communicates with vehicle instrument device or various sensors (such as pressure sensor, speed sensor, current sensor, etc.) through one or more of GPIO interfaces, ADC interfaces, LIN interfaces and CAN interfaces to transmit vehicle sensing data and realize timely sharing of information of the whole vehicle 1.

The number of the first connector 111 can be set according to the maximum number of interfaces provided by the communication control circuit 112, to meet all the functions that the communication control circuit 112 can achieve. For example, if the communication control circuit 112 provides a maximum of six interfaces, the number of the first connectors 111 can be set to six. In this way, the required second connectors can be connected to the corresponding pins of the communication control circuit 112 according to different application scenarios and project requirements. When the requirements change, the connection of the first connector 111 can be adjusted without re-designing the whole circuit, which can meet different application scenarios and project requirements and reduce development and maintenance costs.

Body control circuit 122 may comprise a microprocessor (MCU) or a system on chip (SOC). The body control circuit 122 includes General-purpose input/output (GPIO) interface, Analog-to-Digital Converter (ADC) interface, Local Interconnect Network (LIN) interface, and Controller Area Network (CAN) interface, etc., to transmit body control signals and/or vehicle drive signals with external devices through the second connector 121. For example, the body control circuit 122 can receive the body control signal output by the electronic control unit through one or more of the GPIO interfaces, ADC interfaces, LIN interfaces and CAN interfaces, and output the vehicle drive signals to the body execution system to control its execution of the corresponding operation. Among them, the same type of chip can be used for body control circuit 122 and communication control circuit 112, so as to avoid excessive difference between body control circuit 122 and communication control circuit 112.

The number of the second connector 121 can be set according to the maximum number of interfaces provided by the body control circuit 122, to meet all the functions that the body control circuit 122 can achieve. For example, if the maximum number of interfaces provided by the body control circuit 122 is four, the number of the first connector 111 can be set to four. Thus, the second connector 121 can be connected to the corresponding pins of the body control circuit 122 according to different application scenarios and project requirements. When the requirements change, the connection of the second connector 121 can be adjusted without re-designing the whole circuit, which can meet different application scenarios and project requirements and reduce development and maintenance costs.

In one embodiment, in order to avoid a large difference between the outgoing pins of the communication control circuit 112 and the body control circuit 122, the same type of chip can be used for the communication control circuit 112 and the body control circuit 122, and the first connector 111 and the second connector 121 can use the same type of connectors.

By setting the first circuit board 110 and the second circuit board 120 to be the same size, and setting the communication control circuit 112 and the body control circuit 122 respectively on the same position of the first circuit board 110 and the second circuit board 120, the sharing of the shell of the communication control circuit 112 and the body control circuit 122 can be realized. The plurality of first connectors 111 are set to meet all functional requirements of the communication control circuit 112, and the plurality of second connectors 121 are set to meet all functional requirements of body control circuit 122. Users can adjust the connection of second connectors 121 according to different application scenarios and project requirements, without re-designing the whole circuit and shell. Thus, development and maintenance costs can be reduced while meeting different application scenarios and project requirements.

In one embodiment, the first circuit board 110 further comprises a third area, and the second circuit board 120 further comprises a fourth area, a position of the fourth area in the second circuit board 120 corresponding to a place of the third area in the first circuit board 110, and the body control device 100 further comprises a first signal transmission circuit 113 and a second signal transmission circuit 123. The first signal transmission circuit 113 is arranged on the third area of the first circuit board 110, and the communication control circuit 112 is configured to control the first signal transmission circuit 113 to transmit the communication signal. The second signal transmission circuit 123 is arranged on the fourth area of the second circuit board 120, and the body control circuit 122 is configured to control the second signal transmission circuit 123 to transmit the body control signal and the vehicle drive signals.

In this embodiment, the first signal transmission circuit 113 and the second signal transmission circuit 123 can be realized by a signal transceiver. The first signal transmission circuit 113 and the second signal transmission circuit 123 are respectively set at the same position on the first circuit board 110 and the second circuit board 120 to reduce the difference of outgoing pins between the communication control circuit 112 and the body control circuit 122 and the position difference between the first connection terminal 111 and the second connection terminal 121, and improve the consistency of the shells.

In one embodiment, the first circuit board 110 further comprises a fifth area, and the second circuit board 120 further comprises a sixth area, a position of the sixth area in the second circuit board 120 corresponding to a position of the fifth area of the first circuit board 110. The body control device 100 further comprises a first test circuit 114 and a second test circuit 124. The first test circuit 114 is arranged on the fifth area of the first circuit board 110, and the first test circuit 114 is configured to test the communication control circuit 112. The second test circuit 124 is arranged on the sixth area of the second circuit board 120, and the second test circuit 124 is configured to test the body control circuit 122.

In this embodiment, the first test circuit 114 and the second test circuit 124 are set respectively on the first circuit board 110 and the second circuit board 120 at the same position to reduce the difference of outgoing pins between the communication control circuit 112 and the body control circuit 122 and the position difference between the first connectors 111 and the second connectors 121, so as to improve the consistency of the shells.

Figure 2:
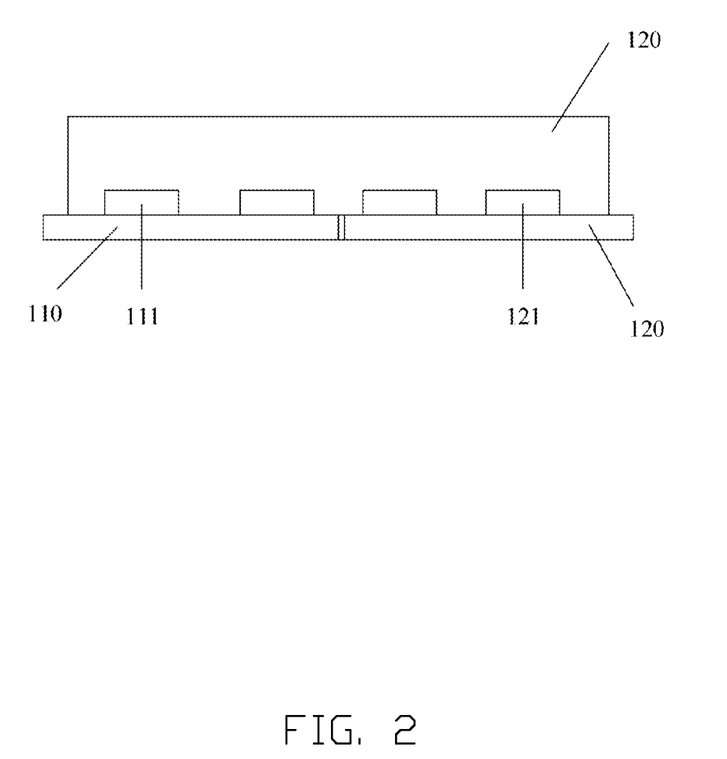
FIG. 2 is a diagram of another embodiment of the body control device according to the present application.

FIG. 2 is a diagram of another embodiment of the body control device 100.

In one embodiment, the body control device 100 further comprises a first shell 130, and the first shell 130, the first circuit board 110 and the second circuit board 120 are enclosed to form a first cavity. The communication control circuit 112, the first signal transmission circuit 113, the body control circuit 122 and the second signal transmission circuit 123 are arranged in the first cavity. The first shell 130 can isolate dust particles and other debris in the environment to avoid the performance of the circuits in the accommodating cavity affected by debris.

Figure 3:
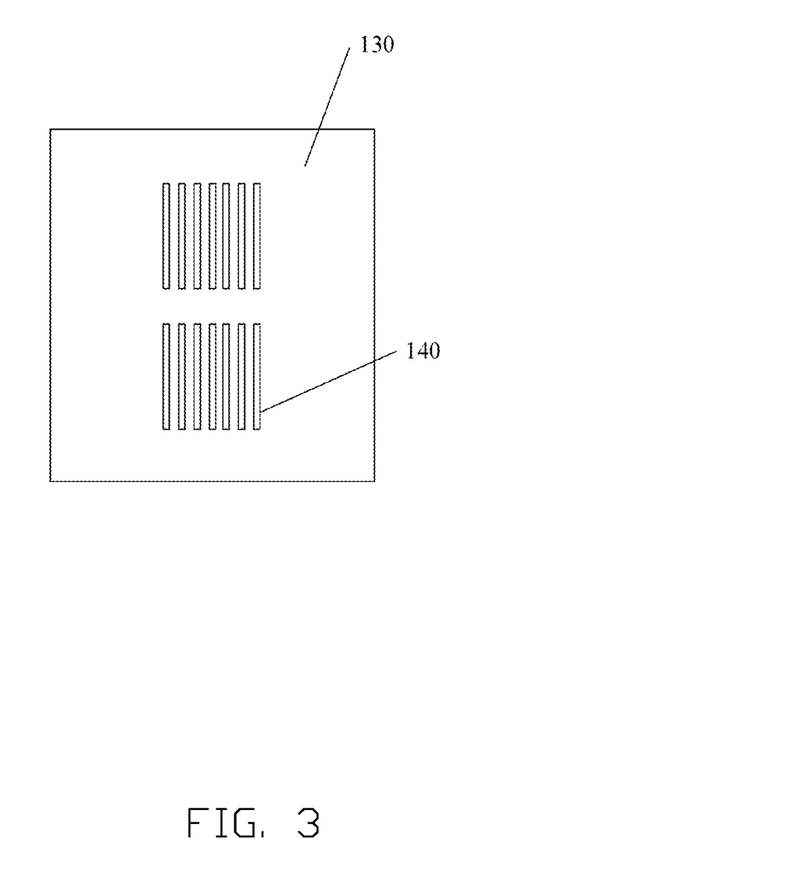
FIG. 3 is a diagram of one embodiment of a first cooling assembly according to the present application.

FIG. 3 is a diagram of one embodiment of a first cooling assembly 140.

In one embodiment, the body control device 100 further comprises the first cooling assembly 140 arranged on the first shell 130. An arranged position of the first cooling assembly 140 corresponds to positions of the communication control 112 circuit and the body control circuit 122, and the first cooling assembly 140 is configured to cooling the communication control circuit 112 and the body control circuit 122.

The number of the first heat dissipation module 140 can be set to two, respectively corresponding to the positions of the communication control circuit 112 and the body control circuit 122.

Furthermore, the communication control circuit 112 and the body control circuit 122 can be arranged close to each other so that the heating area is concentrated. The first cooling assembly 140 can be arranged corresponding to the heating area so that the communication control circuit 112 and the body control circuit 122 can be dissipated simultaneously with the same first cooling assembly 140, reducing the number of the first cooling assembly 140.

In one embodiment, the first shell 130 and the first cooling assembly 140 are integrated.

The first cooling assembly 140 and the first shell 130 are set together to realize the heat dissipation function and save the shell material, thus reducing the weight and material requirements of the shell. For example, the first cooling assembly 140 can choose fin type heat sink or heat dissipation hole.

Furthermore, the first shell 130 can be made of metal material. The metal can speed up the heat conduction with the external environment and improve the heat dissipation performance of the heat dissipation components.

Figure 4:
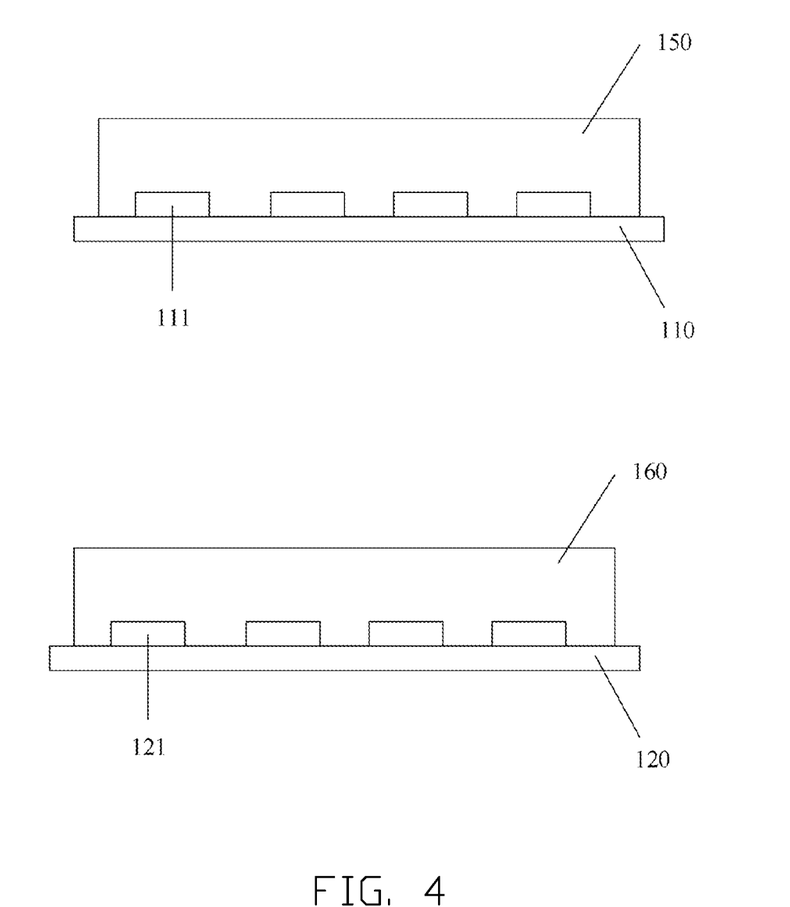
FIG. 4 is a diagram of another embodiment of the body control device according to the present application.

FIG. 4 is a diagram of another embodiment of the body control device 100.

In one embodiment, the body control device 100 further comprises a second shell 150 and a third shell 160. The second shell 150 and the first circuit board 110 are enclosed to form a second cavity. The communication control circuit 112 and the first signal transmission circuit 113 are arranged in the second cavity. The third shell 160 and are enclosed to form a third cavity. The body control circuit 122 and the second signal transmission circuit 123 are arranged in the third cavity.

In this embodiment, the interference between communication control circuit 112 and body control circuit 122 can be avoided by setting the second shell 150 and the third shell 160 respectively.

In one embodiment, a size of the second shell is consistent with a size of the third shell.

Since the size of the first circuit board 110 and the second circuit board 120 is the same, and the communication control circuit 112 and the body control circuit 122 are arranged in the same position on the first circuit board 110 and the second circuit board 120, the second shell 150 can be set with the size of the third shell 160. Thus, the communication control circuit 112 and the body control circuit 122 can use the same the shell. Without designing different shells according to the two circuits, the development and maintenance costs can be reduced further.

Figure 5:
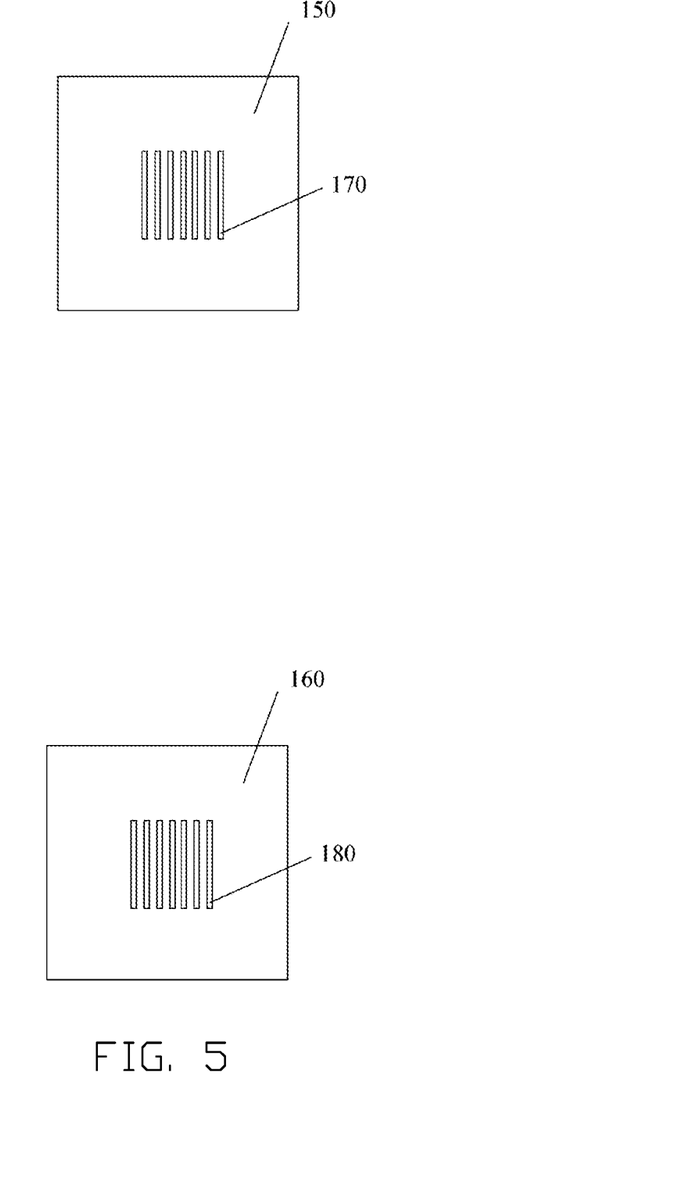
FIG. 5 is a diagram of one embodiment of a second cooling assembly and a third cooling assembly according to the present application.

FIG. 5 is a diagram of one embodiment of a second cooling assembly 170 and a third cooling assembly 180.

In one embodiment, the body control device 100 further comprises the second cooling assembly 170 arranged on the second shell 150. An arranged position of the second cooling assembly 170 corresponds to a position of the communication control circuit 112. The third cooling assembly 180 is arranged on the third shell 160. An arranged position of the third cooling assembly 180 corresponds to a position of the body control circuit 122. The second cooling assembly 170 is configured to cool the communication control circuit 112. The third cooling assembly 180 is configured to cool the body control circuit 122.

Since the position of the communication control circuit 112 and the body control circuit 122 on the first circuit board 110 and the second circuit board 120 is the same, and the size of the second shell 150 is consistent with the third shell 160, the second cooling assembly 170 and the third cooling assembly 180 can also be arranged in the same area on the second shell 150 and the third shell 160 respectively.

Figure 6:
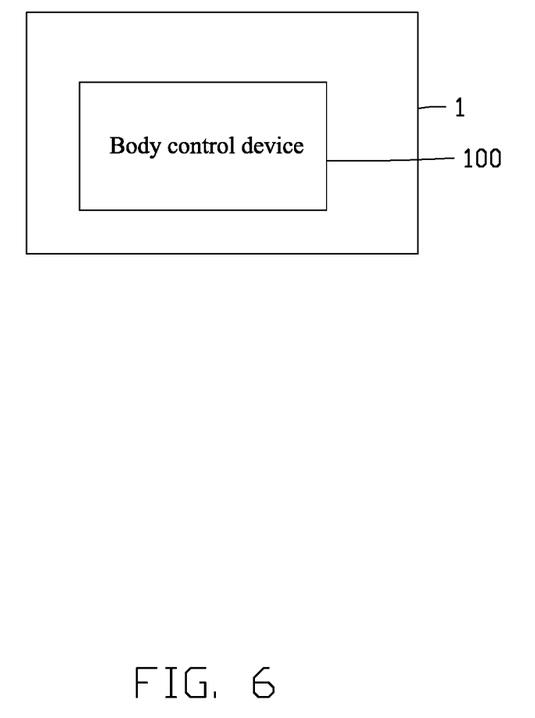
FIG. 6 is a diagram of one embodiment of a vehicle according to the present application.

FIG. 6 is a diagram of one embodiment of a vehicle 1. The vehicle 1 comprises a body control device 100.

The body control device 100 can realize shell sharing of the communication control circuit 112 and the body control circuit 122 by setting the first circuit board 110 and the second circuit board 120 to be the same size, and setting the communication control circuit 112 and the body control circuit 122 respectively on the same position of the first circuit board 110 and the second circuit board 120. Thus simplifying shell design of the communication control circuit 112 and the body control circuit 122, reducing development and maintenance costs of the vehicle 1. The body control device 100 can meet different application scenarios and project requirements by setting the plurality of first connectors 111 and the plurality of second connectors 121, simplifying the circuit design of the communication control circuit 112 and the body control circuit 122, further reducing development and maintenance costs of the vehicle 1.

The exemplary embodiments shown and described above are only examples. Many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A body control device, comprising:
a first circuit board comprising a first area;
a plurality of first connectors arranged on an outer edge of the first circuit board, the plurality of first connectors being configured to electrically connect with an external device, and the plurality of first connectors being configured to transmit communication signals;
a communication control circuit arranged on the first area of the first circuit board, and the communication control circuit being electrically connected with the plurality of the first connectors;
a second circuit board comprising a second area, wherein a position of the second area in the second circuit board corresponds to a position of the first area in the first circuit board, and a size of the second circuit board is consistent with a size of the first circuit board;
a plurality of second connectors arranged on an outer edge of the second circuit board, the plurality of second connectors being configured to electrically connect with the external device, and the plurality of second connectors being configured to transmit body control signals and/or vehicle drive signals; and
a body control circuit arranged on the second area of the second circuit board, wherein the body control circuit is electrically connected with the plurality of the second connectors, and the body control circuit is configured to output the vehicle drive signals according to the body control signals;
wherein the first circuit board further comprises a third area, and the second circuit board further comprises a fourth area, a position of the fourth area in the second circuit board corresponds to a position of the third area in the first circuit board, and the body control device further comprises:
a first signal transmission circuit arranged on the third area of the first circuit board, wherein the communication control circuit is configured to control the first signal transmission circuit to transmit the communication signals, and
a second signal transmission circuit arranged on the fourth area of the second circuit board, the body control circuit is configured to control the second signal transmission circuit to transmit the body control signals and the vehicle drive signals.

2. The body control device of claim 1, wherein the first circuit board further comprises a fifth area, and the second circuit board further comprises a sixth area, a position of the sixth area in the second circuit board corresponds to a position of the fifth area in the first circuit board, the body control device further comprises:
a first test circuit arranged on the fifth region of the first circuit board, and the first test circuit is configured to test the communication control circuit, and
a second test circuit arranged on the sixth area of the second circuit board, and the second test circuit is configured to test the body control circuit.

3. The body control device of claim 1, further comprising a first shell, wherein the first shell, the first circuit board, and the second circuit board are enclosed to form a first cavity, and the communication control circuit, the first signal transmission circuit, the body control circuit, and the second signal transmission circuit are arranged in the first cavity.

4. The body control device of claim 3, further comprising a first cooling assembly, wherein the first cooling assembly is arranged on the first shell, an arranged position of the first cooling assembly corresponds to positions of the communication control circuit and the body control circuit, and the first cooling assembly is configured to cool the communication control circuit and the body control circuit.

5. The body control device of claim 4, wherein the first shell and the first cooling assembly are integrated.

6. The body control device of claim 1, further comprising:
a second shell and a third shell,
wherein the second shell and the first circuit board are enclosed to form a second cavity, and the communication control circuit and the first signal transmission circuit are arranged in the second cavity, and
the third shell and the second circuit board are enclosed to form a third cavity, and the body control circuit and the second signal transmission circuit are arranged in the third cavity.

7. The body control device of claim 6, wherein a size of the second shell is consistent with a size of the third shell.

8. The body control device of claim 7, further comprising:
a second cooling assembly arranged on the second shell; and
a third cooling assembly arranged on the third shell,
wherein an arranged position of the second cooling assembly corresponds to a position of the communication control circuit, and the second cooling assembly is configured to cool the communication control circuit, and
an arranged position of the third cooling assembly corresponds to a position of the body control circuit, and the third cooling assembly is configured to cool the body control circuit.

9. A vehicle comprising a body control device, the body control device comprising:
a first circuit board comprising a first area;
a plurality of first connectors arranged on an outer edge of the first circuit board, the plurality of first connectors being configured to electrically connect with an external device, and the plurality of first connectors being configured to transmit communication signals;
a communication control circuit arranged on the first area of the first circuit board, and the communication control circuit being electrically connected with the plurality of the first connectors;
a second circuit board comprising a second area, wherein a position of the second area in the second circuit board corresponds to a position of the first area in the first circuit board, and a size of the second circuit board is consistent with a size of the first circuit board;
a plurality of second connectors arranged on an outer edge of the second circuit board, the plurality of second connectors being configured to electrically connect with the external device, and the plurality of second connectors being configured to transmit body control signals and/or vehicle drive signals; and
a body control circuit arranged on the second area of the second circuit board, wherein the body control circuit is electrically connected with the plurality of the second connectors, and the body control circuit is configured to output the vehicle drive signals according to the body control signals;
wherein the first circuit board further comprises a third area, and the second circuit board further comprises a fourth area, a position of the fourth area in the second circuit board corresponds to a position of the third area in the first circuit board, and the body control device further comprises:
a first signal transmission circuit arranged on the third area of the first circuit board, wherein the communication control circuit is configured to control the first signal transmission circuit to transmit the communication signals, and
a second signal transmission circuit arranged on the fourth area of the second circuit board, the body control circuit is configured to control the second signal transmission circuit to transmit the body control signals and the vehicle drive signals.

10. The vehicle of claim 9, wherein the first circuit board further comprises a fifth area, and the second circuit board further comprises a sixth area, a position of the sixth area in the second circuit board corresponds to a position of the fifth area in the first circuit board, the body control device further comprises:
a first test circuit arranged on the fifth region of the first circuit board, and the first test circuit is configured to test the communication control circuit, and
a second test circuit arranged on the sixth area of the second circuit board, and the second test circuit is configured to test the body control circuit.

11. The vehicle of claim 9, wherein the body control device further comprises a first shell, wherein the first shell, the first circuit board, and the second circuit board are enclosed to form a first cavity, and the communication control circuit, the first signal transmission circuit, the body control circuit, and the second signal transmission circuit are arranged in the first cavity.

12. The vehicle of claim 11, wherein the body control device further comprises a first cooling assembly, wherein the first cooling assembly is arranged on the first shell, an arranged position of the first cooling assembly corresponds to positions of the communication control circuit and the body control circuit, and the first cooling assembly is configured to cool the communication control circuit and the body control circuit.

13. The vehicle of claim 12, wherein the first shell and the first cooling assembly are integrated.

14. The vehicle of claim 9, wherein the body control device further comprises:
a second shell and a third shell,
wherein the second shell and the first circuit board are enclosed to form a second cavity, and the communication control circuit and the first signal transmission circuit are arranged in the second cavity, and the third shell and the second circuit board are enclosed to form a third cavity, and the body control circuit and the second signal transmission circuit are arranged in the third cavity.

15. The vehicle of claim 14, wherein a size of the second shell is consistent with a size of the third shell.

16. The vehicle of claim 15, wherein the body control device further comprises:

a second cooling assembly arranged on the second shell; and a third cooling assembly arranged on the third shell, wherein an arranged position of the second cooling assembly corresponds to a position of the communication control circuit, and the second cooling assembly is configured to cool the communication control circuit, and an arranged position of the third cooling assembly corresponds to a position of the body control circuit, and the third cooling assembly is configured to cool the body control circuit.

* * * * *